(12) United States Patent
Birru

(10) Patent No.: US 7,020,828 B2
(45) Date of Patent: Mar. 28, 2006

(54) TRELLIS ENCODER WITH RATE 1/4 AND 1/2 FOR A BACKWARD COMPATIBLE ROBUST ENCODING ATSC DTV TRANSMISSION SYSTEM

(75) Inventor: Dagnachew Birru, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 527 days.

(21) Appl. No.: 10/183,672

(22) Filed: Jun. 27, 2002

(65) Prior Publication Data

US 2003/0079173 A1    Apr. 24, 2003

Related U.S. Application Data

(60) Provisional application No. 60/348,723, filed on Oct. 23, 2001.

(51) Int. Cl.
*H04N 7/64*  (2006.01)

(52) U.S. Cl. .................. 714/792; 348/425.2; 348/466; 375/265; 714/755

(58) Field of Classification Search ................ 714/755, 714/786, 792; 348/425.2, 466, 729; 375/265; H04N 7/64
See application file for complete search history.

(56) References Cited

U.S. PATENT DOCUMENTS

2002/0181581 A1* 12/2002 Birru et al. ............ 375/240.01
2002/0191712 A1* 12/2002 Gaddam et al. ............ 375/301
2002/0194570 A1* 12/2002 Birru et al. ................. 714/792
2003/0099303 A1*  5/2003 Birru et al. ................. 375/265

FOREIGN PATENT DOCUMENTS

WO    WO 200147253 A1 *  6/2001
WO    WO 2004057876 A1 *  7/2004

OTHER PUBLICATIONS

Bretl, W.E.; Touzni, A.; Enhanced VSB system; Consumer Electronics, IEEE Transactions on , vol.: 48 , Issue: 3 , Aug. 2002; pp.: 533-538.*
Tawil, V.; Testing enhancements to the ATSC VSB terrestrial digital television standard; Consumer Electronics, 2002. ICCE. 2002 Digest of Technical Papers. International Conference on , Jun. 18-20, 2002; pp.: 150-151.*
US010278 U.S. Appl. No.: 10/118,876, pending.
US010173 U.S. Appl. No.: 10/078,933, pending.

* cited by examiner

*Primary Examiner*—R. Stephen Dildine
(74) *Attorney, Agent, or Firm*—Larry Liberchuk

(57) ABSTRACT

Robust and existing standard bit streams are mixed in a backward compatible manner for forming enhanced modes for better reception of ATSC DTV signals. This is achieved by an enhanced coding block provided at the input of a conventional ATSC trellis encoder unit. The enhanced coding block comprising a trellis encoder encodes only the robust stream while passing the normal standard stream unaltered.

20 Claims, 7 Drawing Sheets

| Byte type | N/R | Mod type | rate | en | ml |
|---|---|---|---|---|---|
| Normal (full rate) | 1 1 1 1 | - - - - | - - - - | 1 1 1 1 | - - - - |
| Rate ½ 2-VSB mode | 0 0 0 0 | 1 1 1 1 | 1 1 1 1 | 1 1 1 1 | 1 1 1 1 |
| Rate ¼ 2-VSB mode | 0 0 0 0 | 1 1 1 1 | 0 0 0 0 | 1 0 1 0 | 1 0 1 0 |
| Rate ½ 8-VSB mode | 0 0 0 0 | 0 0 0 0 | 1 1 1 1 | 0 0 0 0 | - - - - |
| Rate ¼ 8-VSB mode | 0 0 0 0 | 0 0 0 0 | 0 0 0 0 | 0 0 0 0 | - - - - |

| Type/mix ratio | 100% | 5% robust | 10% robust | 25% robust | 50% robust |
|---|---|---|---|---|---|
| Normal (full rate) | 15 dB | NM | NM | NM | NM |
| Rate ½ 2-VSB mode | 7.3 dB | 7.0 dB | 7.0 dB | 7.1 dB | 7.2 dB |
| Rate ¼ 2-VSB mode | NS | 2.0 dB | 2.0 dB | 2.1 dB | 2.2 dB |
| Rate ½ 8-VSB mode | 7.7 dB | 10.0 dB | 9.0 dB | 8.5 dB | NS |
| Rate ¼ 8-VSB mode | NS | 6.0 dB | 5.8 dB | 5.7 dB | NS |

Fig. 6

TRELLIS ENCODER WITH RATE 1/4 AND 1/2 FOR A BACKWARD COMPATIBLE ROBUST ENCODING ATSC DTV TRANSMISSION SYSTEM

CROSS-REFERENCE TO RELATED APPLICATION

Applicants claim the priority benefits under 35 U.S.C. §119(e) of U.S. Provisional Application Ser. No. 60/348,723, filed on Oct. 23, 2001, entitled TRELLIS ENCODER FOR RATE 1/4 AND 1/2 ROBUST CODING FOR A BACKWARD COMPATIBLE ATSC DTV TRANSMISSION STANDARD, the entire disclosure and content of which is incorporated herein by its reference.

Additionally, co-assigned, co-pending U.S. patent application Ser. No. 10/078,933, filed Feb. 19, 2002, entitled ENHANCED ATSC DIGITAL TELEVISION SYSTEM, and co-assigned, co-pending U.S. patent application Ser. No. 10/142,585, filed May 9, 2002, entitled A DIGITAL TELEVISION (DTV) TRANSMISSION SYSTEM USING ENHANCED CODING SCHEMES are incorporated by reference in their entirety as if fully set forth herein.

FIELD OF INVENTION

The present invention generally relates to the field of High Definition Television (HDTV). More specifically, the present invention is directed to a system and apparatus for encoding a digital television robust bit stream for enhanced signal to noise ratio and in a backward compatible manner.

BACKGROUND

In the television broadcasting industry, an attempt is being made to enhance high definition television (HDTV) systems to account for problems associated with broadcasting broadband signals over existing television frequency channels. Some of the problems encountered when broadcasting any signal over existing television frequencies include phase interference caused by multipath signal reception, signal fading, and signal attenuation caused by atmospheric conditions, terrain conditions, distance from the transmission source, and the like. These problems are exacerbated when an attempt is made to send and recover a digital signal in an error free manner, such as required by the current HDTV standard for non-degraded HDTV reception.

The current HDTV standard as promulgated by the Advanced Television Systems Committee (ATSC) employs many features to make use of the limited bandwidth, i.e., 6 MHz, available for HDTV transmission on air and in cable. For example, the HDTV baseband signal undergoes the known MPEG 2 compression, and a known type of forward error correction (FEC) Reed Solomon (RS) encoding in order to compress and error correct the data payload associated with HDTV transmission. The HDTV standard also calls for randomization of the bit stream by injection of a pseudorandom code to ensure that the signal is evenly distributed across the allocated spectrum, i.e., channel. As is known in the art, data interleaving is also implemented to scramble the sequential order of the data stream and to disperse the MPEG 2 packet data throughout time in order to minimize the transmitted signal's sensitivity to burst type interference. To further accommodate the 6 MHz allotted to the transmission channel, the interleaved HDTV bit stream of packets is further encoded to limit the number of amplitude levels required in transmission.

The current ATSC standard calls for vestigial sideband transmission with 8 discrete amplitude levels (8-VSB), i.e., channel symbols. One encoding method that implements additional FEC while achieving the 8-VSB requirement is known as the trellis code. Trellis codes, which are convolutional, i.e., serial and dependent on previous information bit values, are a known method of data encoding. The current ATSC specification calls for a 2/3 trellis code for 8-VSB. As is known, the 2/3 ratio specifies that the trellis code will encode 3 bits for every 2 bits input to the encoder, i.e., a 2/3 rate encoder is specified. According to the present state of the art, existing receivers are implemented to decode the 2/3 encoding of the specified 2/3 trellis encoder.

FIG. 1 illustrates an exemplary prior art HDTV transmission encoding system. As shown, a standard packet stream 110 is input into the system where the stream is first randomized by data randomizer block 120 and encoded by Reed Solomon (RS) encoder 130. For the reasons discussed above, the randomized and encoded packet stream is then interleaved by data interleaver 140. Trellis encoder 150, typically running at a 2/3 encoding rate, then prepares the packet stream for 8-VSB modulation by encoding the bit stream to eight discrete levels. The Trellis encoded packet stream 180 is then routed to an 8-VSB modulator (Not Shown) for transmission of the HDTV signal.

FIG. 2 depicts an exemplary prior art trellis encoder, shown in more detail. A precode sequence is generated by an interference filter pre-coder 210 from the $X_2$ input, which is the most significant part of a randomized packet stream containing HDTV information. The filter output is then routed to trellis encoder 215 where it is fed through without any further processing to the $Z_2$ output. The $X_1$ input represents the least significant part of a randomized packet stream containing HDTV information. The trellis encoder feeds $X_1$ through to the $Z_1$ output. The $Z_0$ output is a function of the $X_1$ input and historical (two 12 symbol delay blocks, D) $X_1$ values. The three bit $Z_2 Z_1 Z_0$ combination is mapped by an 8-level symbol mapper 220 to the R channel symbols representing the eight discrete levels for 8-VSB modulation. It should be noted that in addition to utilizing a 2/3 encoding rate with one bit pre-coded so as to maintain an effective encoding rate of 1/2, the existing A/53 prior art, i.e., legacy trellis encoder for HDTV transitions through 4 states, i.e., the A/53 trellis encoder is a four state machine. A complete discussion of 4 state trellis encoding may be found in U.S. patent to Csajka et al (U.S. Pat. No. 4,077,021), and is incorporated herein by reference.

Under ideal reception conditions, i.e., no multipath signal interference, atmospheric or other type interference, the above known transmission encoding scheme is adequate to deliver the payload, i.e. HDTV signal, to a receiver with no degradation in picture quality. However, terrestrial, i.e., on-air television broadcasting may encounter many types of interference and disturbance between the transmission system and the reception system. Signal strength loss and interference contribute to a minimum threshold of visibility (TOV), typically measured in decibels (DB) also measured as carrier to noise ratio (CNR) above a noise/interference level, under which the HDTV signal simply cannot be recovered.

While the above discussed prior art system is beneficial in the capability to transmit an HDTV signal over an existing legacy on air channel such as the 6 MHz wide channel discussed above, there remains the drawback of maintaining a relatively high TOV over interference and noise for successful reception of the HDTV signal. In real world applications, however, HDTV signal attenuation and degradation due to a variety of factors, such as those discussed above, are likely, when encountered, to cause an 8-VSB signal to fall below its required TOV, resulting in disruption of reception at an HDTV receiver. While legacy analog systems may degrade slowly under interference, i.e., the picture may gradually fade away into a noise signal (snow), the digital HDTV signal will suddenly freeze at the below TOV level. While a robust data stream solves the problem of reducing the TOV in order to maintain HDTV viewing under less than ideal conditions, there remains the problem of maintaining compatibility with legacy, i.e., prior art HDTV transmission and reception systems. The prior art simply has a need for a more robust and backwards compatible HDTV system.

SUMMARY OF THE INVENTION

Therefore, it is an object of the present invention to provide a system and apparatus for increasing the robustness of an HDTV transmission stream while maintaining backward compatibility with existing HDTV reception systems by using an enhanced coding scheme concatenated with the legacy encoding scheme.

This and other objects and advantages may be obtained in the present invention by providing a system, apparatus and method that implements a backwards compatible, robust HDTV bit stream of packets that significantly reduces TOV/CNR requirements for successful HDTV reception. Specifically, there is provided an apparatus for HDTV packet transmission that comprises an enhanced coding block which includes a trellis encoder having a plurality of multiplexers for multiplexing robust and standard bit streams, the enhanced coding block being connected to an A/53 trellis encoder comprising a pre-coder, the A/53 trellis encoder, and a symbol mapper, wherein the enhanced coding block further comprises a feedback input for accepting signals from the pre-coder of the A/53 block; and the symbol mapper including a subset of the A/53 symbol set associated with the standard bit stream of packets in conjunction with the robust bit stream for modulating a transmitter in a backward compatible manner.

BRIEF DESCRIPTION OF THE DRAWING

The present invention will now be described in more detail by referring to the drawings that accompany the present application. It is noted that in the accompanying drawings like reference numerals are used for describing like and corresponding elements thereof.

FIG. 5 depicts a truth table representing a preferred control bit generating means for the enhanced coding block;

FIG. 6 is a table of simulated performance results for an Added White Gaussian Noise (AWGN) channel for various mix ratios of the normal stream with the corresponding robust stream, wherein NS means not simulated, and NM means Not Measured, and shows TOV advantages of this invention for various mixes of standard and robust streams.

DETAILED DESCRIPTION OF THE PREFERRED EMBODIMENT

Although this invention is applicable to numerous and various types of data transmission encoding systems, it has been found particularly useful in the environment of HDTV systems. Therefore, without limiting the applicability of the invention to HDTV systems, the invention will be described in such an environment. Such an HDTV system is described in co-pending U.S. Patent Applications, Ser. No. 60/295,616 entitled PACKET IDENTIFICATION MECHANISM AT THE TRANSMITTER AND THE RECEIVER FOR AN ENHANCED ATSC 8-VSB SYSTEM; 60/301,559 entitled PROPOSAL FOR A POTENTIAL REVISION OF THE ATSC DTV STANDARD USING ENHANCED CODING SCHEMES; 60/324,482 entitled KEY ELEMENTS FOR THE NEWLY PROPOSED ATSC STANDARD; 60/280,782 entitled PROPOSAL FOR AN IMPROVED ATSC DTV STANDARD; the entire disclosures and content of which are incorporated herein by their reference.

Figure 3:
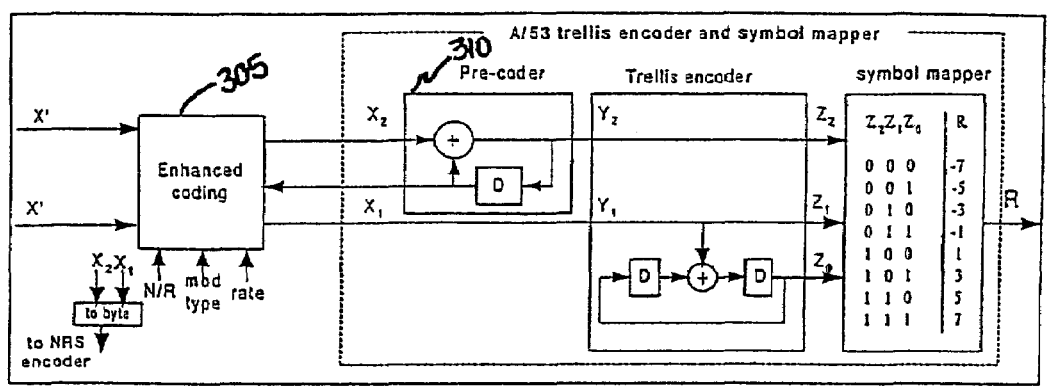
FIG. 3 shows a block diagram illustrating a trellis encoder with a preferred concatenated encoding for a robust stream.

A preferred implementation of the current invention will support a flexible payload data-rate in, preferably, a 6 MHz channel and with a flexible CNR. In one aspect of this invention, as shown in FIG. 3, combined robust and standard bit streams $X'_1$ and $X'_2$ are input to enhanced coding block 305 which comprises a first trellis encoder device described in detail with respect to FIG. 4.

Figure 4:
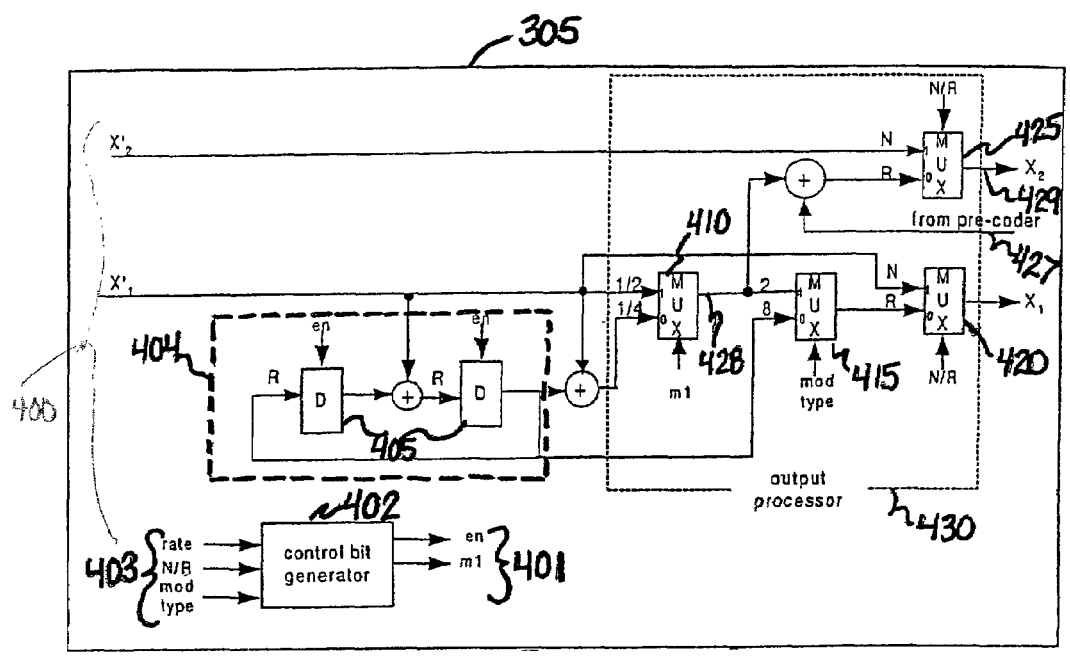
FIG. 4 shows a block diagram illustrating a preferred upper coding scheme in the trellis encoder to achieve 2-VSB mapping or enhanced 8-VSB encoding.

FIG. 4 illustrates the enhanced coding block 305 which comprises a trellis encoder providing an upper coding scheme to achieve 2-VSB mapping or enhanced 8-VSB encoding with a 16-state rate 1/3 trellis encoder to achieve a rate 1/4 or 1/2 robust stream encoding. It should be understood that this encoder may additionally be converted to a 32 state or higher state to provide even greater error correction capability. As shown in FIG. 4 the $X'_1$ bit stream is input to the 1/2 input of a first stage multiplexer 410. The contents of two twelve symbol delay registers, D 405, comprising historical values of the bit stream are combined with the $X'_1$ signal and input to the 1/4 code rate select input of the multiplexer 410.

The first stage multiplexer 410 output is both combined with pre-coder data from the prior art A/53 trellis encoder (FIG. 2, 210) and input to the "2", i.e., 2-VSB modulation select input, of a second stage multiplexer 415. Multiplexer 410 functions in a known 2 to 1 manner, which means that either the 1/2 or the 1/4 coded input is selected for output, according to the control bit m1.

The second stage multiplexer 415 additionally includes an "8", i.e., 8-VSB modulation select, input from delay block 404. An output of the second stage multiplexer 415 is then fed to the R, i.e., standard stream select, input of third stage multiplexer 420 where its second input, the N, i.e., robust stream select input, comprises the original $X'_1$ bit stream. Multiplexer 415 functions in a known 2 to 1 manner, which means that either the 2-VSB or the 8-VSB coded input is selected for output, according to the "mod type" control bit.

Figure 1:
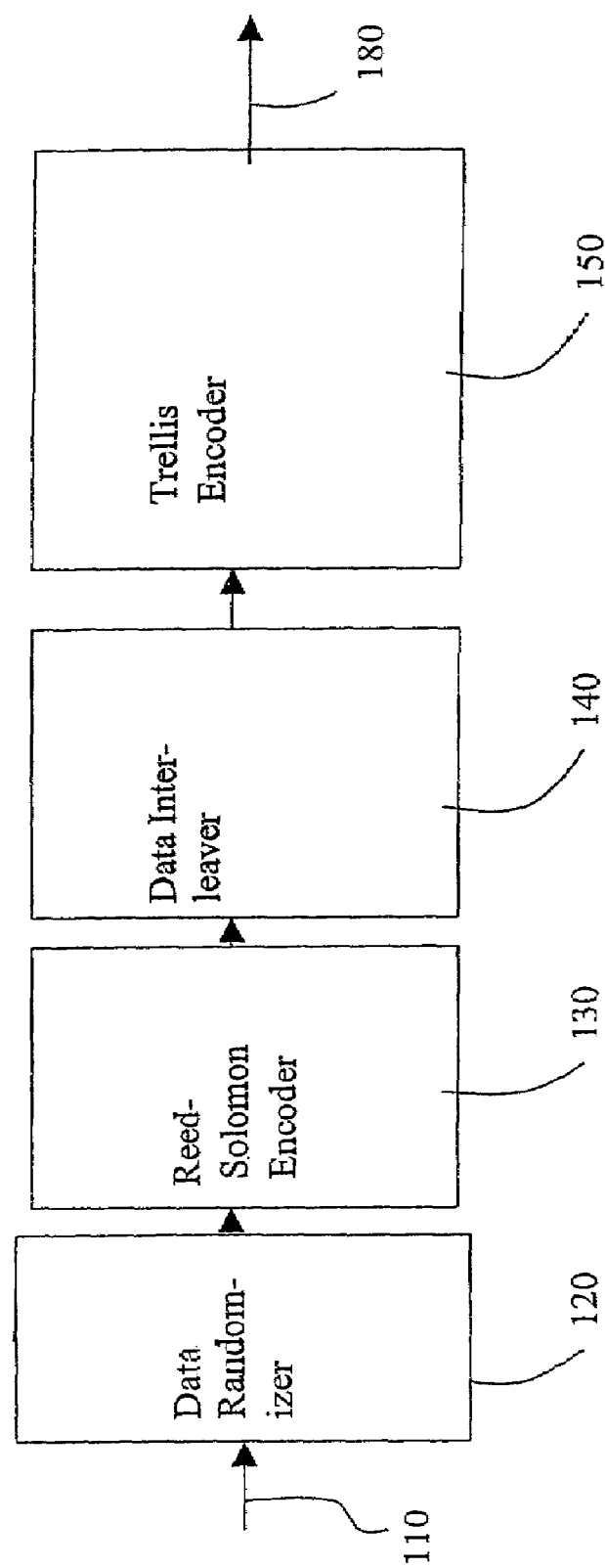
FIG. 1 shows a prior art HDTV transmission system packet flow.
Figure 2:
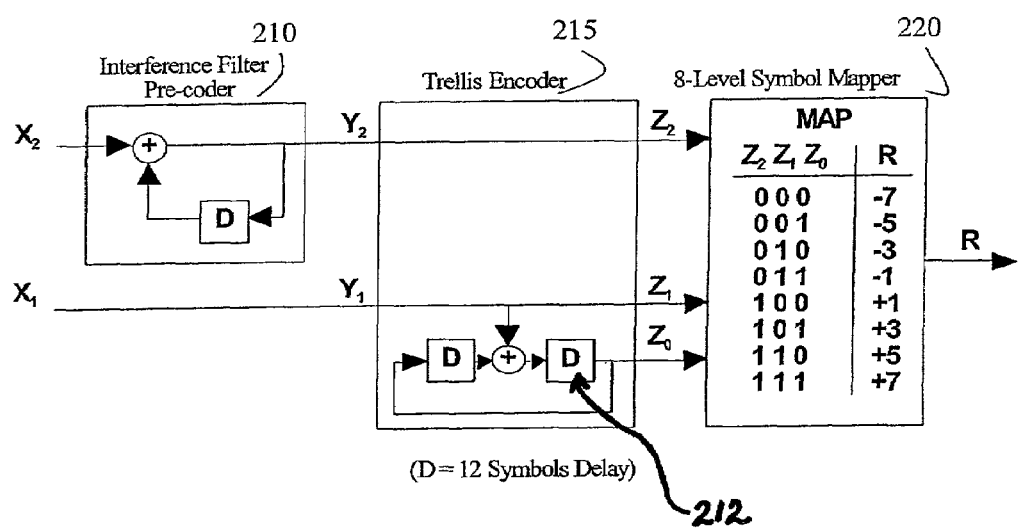
FIG. 2 shows packet flow through a prior art configured filter, trellis encoder, and 8 level symbol mapper.

The output $X_1$ of the third stage multiplexer 420 corresponds to the $X_1$ input of the prior art A/53 trellis encoder (FIG. 2, 215). Multiplexer 420 functions in a known 2 to 1 manner, which means that either the Normal stream, "N" or the Robust Stream, "R" input is selected for output, according to the "N/R" control bit.

Pre-coder multiplexer 425 includes as its R input, the combined pre-coder data 427 from the prior art A/53 trellis encoder (FIG. 2 210) and first stage multiplexer 410 output 428. The pre-coder multiplexer 425 generates an output 429 that corresponds to the $X_2$ input of the prior art A/53 trellis encoder (FIG. 2 215). Multiplexer 425 functions in a known 2 to 1 manner, which means that either the Normal stream, "N" or the Robust Stream, "R" input is selected for output, according to the "N/R" control bit. Details of the prior art A/53 trellis encoder are discussed in the *ATSC Standard: Digital Television Standard, Revision B*, Document A/53B, dated 7 Aug. 2001, which contents in its entirety is incorporated herein by reference.

It should be understood that the combination of prior art trellis encoder 215, pre-coder 210 and enhanced coding block 305 comprising trellis encoder 400 may provide a 16 state encoding process with the prior art 8 symbol levels compatible with existing 8-VSB modulation. The 8-VSB symbol mapping scheme used in conjunction with a 16 state trellis encoder for encoding a robust bit stream, comprises an enhanced 8-VSB mode. Additionally, the control bit generator 402 which applies control bits to delay registers 405, multiplexers 410, 415 and 420 allows for selection between normal, i.e., standard stream bits for 8-VSB and robust stream bits for enhanced 8-VSB, as well as enhanced 2-VSB modes.

Using a subset of the 8-VSB symbol set, the pre-coding for 2-VSB mode is obtained by, preferably, equating $Z_2$ and $Z_1$ to the information bit, i.e., robust data stream bit. Pre-coder input $X_2$ is calculated by control bit generator 402 such that the pre-coder output $Z_2$ is the information bit. Correspondingly, $X_1$ is equated to the information bit. The operation performed is $X_2=X_1+Y_{2d}$ mod 2, where $Y_{2d}$ is the register contents of pre-coder 310. The resultant symbol mapping at the output of the trellis encoder then becomes $\{-7, -5, 5, 7\}$. Symbol values from the foregoing alphabet $\{-7, -5, 5, 7\}$ are used for 2-VSB modulation.

Since the information bit has been encoded as the sign of the symbols, i.e., either a positive symbol or a negative symbol, the number of symbols carrying information is therefore 2, resulting in 2-VSB, i.e., pseudo 2-VSB, modulation at symbol mapper output R.

Thus, robust packets on the receiver side may be decoded without being error flagged. It should be noted that the term "robust stream" refers to any data stream with HDTV content that is transmitted at a reduced bit rate from the nominal standard stream rate of 19.39 Mbps.

It is understood that both the standard stream and the robust stream are preferably comprised of 188-byte MPEG-compatible data packets which include a sync byte and 187 bytes of data. With 20 RS parity bytes added by the RS encoder block 130 upstream from the trellis encoder, the MPEG compatible data packets comprise 207 bytes of data.

As an example, the 1/4 trellis encoding scheme which adds 4 encoding bits for every 1 robust stream bit results in four 207 byte length packets for transmission downstream. It is also known that the standard stream sends a 32 bit Program Identifier (PID) in a Program Map Table (PMT) as specified by the MPEG 2 systems standard in ISO/IEC 13818-1. A preferable implementation of the current invention involves generating robust packets with a PID, preferably null, that is different from the PID as specified by the existing MPEG 2 systems standard. As a consequence, backwards compatibility is achieved because existing, i.e., legacy, receivers will ignore the transmitted robust packets encoded with PID's that are not a member of the PMT.

Figure 7:
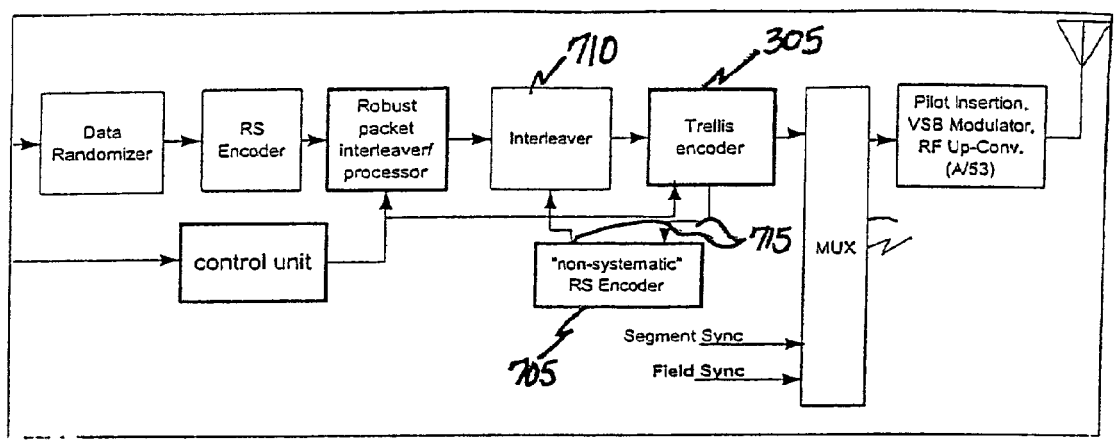
FIG. 7 is a simplified top-level diagram of the enhanced ATSC transmitter, and shows the inventive transmission system with trellis encoder and non-systematic RS encoder feedback for standard stream compatibility.

FIG. 7 illustrates a top level diagram of an enhanced ATSC transmitter, the details of which are discussed in co-assigned, co-pending U.S. patent application Ser. No. 10/127,531, filed Apr. 22, 2002, entitled AN IMPROVED DIGITAL TRANSMISSION SYSTEM FOR AN ENHANCED ATSC 8-VSB SYSTEM, co-assigned, co-pending U.S. patent application Ser. No. 10/142,585, filed May 9, 2002, entitled A DIGITAL TELEVISION (DTV) TRANSMISSION SYSTEM USING ENHANCED CODING SCHEMES, and co-assigned, co-pending U.S. patent application Ser. No. 10/118,876, Apr. 9, 2002, entitled PACKET IDENTIFICATION MECHANISM AT THE TRANSMITTER AND RECEIVER FOR AN ENHANCED ATSC 8-VSB SYSTEM, and are incorporated by reference in their disclosures and content as if fully set forth herein. Additionally, an optional RS encoder which is, preferably, "non-systematic" (FIG. 7 at 705) and includes a feedback path 715 from the enhanced coding block, i.e. trellis encoder 305 to an interleaver 710 upstream from the enhanced coding block may be included to provide parity byte generation that is backward compatible with legacy receivers. This compatibility is provided by assuring that the 20 Reed Solomon (RS) parity bytes are placed at the end of all bytes containing standard 8-VSB information bits, as RS decoders in legacy receivers expect this positioning for RS parity bytes as described in commonly-owned, co-pending U.S. patent application Ser. No. 10/142,585, filed May 9,. 2002, entitled A DIGITAL TELEVISION (DTV) TRANSMISSION SYSTEM USING ENHANCED CODING SCHEMES.

In a preferred implementation of the invention, the trellis encoder 400 processes a byte by encoding two consecutive bits at a time to convert an 8 bit input into 4 symbols. The control bits 401 preferably are specified for each two bit group within a byte. Therefore, to convert a byte, the value of each control bit may change four times in accordance with the 2 bits to be encoded. Referring to FIG. 5, a representative truth table of the control bits for byte encoding is illustrated.

FIG. 5 illustrates a truth table for generating the control bits required to encode a byte according to a desired signal modulation, symbol encoding scheme and rate. Preferably, the information specified by a broadcaster, for example, and included in the packet streams, the "Byte stream type", "N/R", i.e. standard stream/robust stream, "Mod type", i.e., modulation type, "rate", i.e., encoding rate, provides control inputs 403 which may be tracked by control unit 402 to determine "en", i.e., symbol delay enable, and "m1", i.e., first stage multiplexer select output values of control unit 402.

The particular control bit patterns are for illustration purposes, and do not preclude other bit patterns, e.g., using positive or negative logic, and/or other hexadecimal values defined with the same logical effect. As an example, using the control scheme depicted in FIG. 5, the 1111, i.e., hexadecimal (hex) pattern "F" in the N/R field 515 designates that a normal, i.e., full rate standard stream symbol is currently being processed. Note that in this event all other fields except for the en field 530 which also has a hex value of "F", are "don't cares".

Continuing with the current example, and referring to FIGS. 4 and 5, it is observed that the "en" input of "F" to symbol delay registers 405 inhibits shifting the current byte into the registers 405. Additionally, the "N/R" input of "F" to pre-coder multiplexer 425 and third stage multiplexer 420 select the "N", i.e., standard stream data path for throughput through the output of the trellis encoder 400. In a similar manner, other data stream symbols belonging to other permutations of "byte type", "N/R", "Mod type", "rate", "en", and "m1" control the trellis encoder of enhanced coding block 305 according to truth table 501 of FIG. 5.

Referring to FIG. 6, it is shown that for various mixes of standard and robust streams produced by a preferred implementation of this invention, signal decoding is enhanced over the prior art standard stream approach. As shown, simulated tests with added white gaussian noise (AWGN) have indicated that this invention can provide a signal which can be decoded with a CNR of only 2.0 db, as opposed to the 15 db requirement when a 100% standard stream of the prior art is used. The actual TOV advantage is a function of the stream type mix ratio, encoder rate, and modulation type. A preferred mix ratio 605 of robust stream to standard stream for 2-VSB mode encoding ranges from 5% robust to 50% robust. A preferred mix ratio 610 of robust stream to standard stream for 8-VSB mode encoding ranges from 5% robust to 25% robust.

Now that the invention has been described by way of a preferred embodiment, various modifications and improvements will occur to those of skill in the art. For example, the output processor block 430 of the trellis encoder 400 can alternatively be designed with a single logic unit that achieves the same functionality. Thus, it should be understood that the preferred embodiment is provided as an example and not as a limitation. The scope of the invention is defined by the appended claims.

What is claimed is:

1. In an HDTV transmission system including a transmitter for transmitting a standard bit stream and a robust bit stream for receipt by an HDTV receiver device, an apparatus for encoding both bit streams in a backward compatible manner, said apparatus comprising:
    an enhanced coding block comprising a trellis encoder including a plurality of delay registers for delaying encoded bits of said both bit streams in response to control signals;
    said trellis encoder further comprising a plurality of multiplexers for multiplexing said both bit streams;
    a control unit tracking a bit stream type and generating the control signals for controlling the delay registers and the plurality of multiplexers of said trellis encoder according to the bit stream type;
    said enhanced coding block further comprising:
    a feedback input for accepting signals from a pre-coder of an A/53 trellis encoder; said A/53 trellis encoder operating in accordance with the ATSC A/53 standard; and
    a connection to the A/53 trellis encoder wherein a symbol mapper of the A/53 trellis encoder includes a subset of an A/53 trellis encoder symbol alphabet, said subset being associated with the robust bit stream for modulating a transmitter in a manner compatible with both standard and robust bit streams.

2. The apparatus for encoding as claimed in claim 1, wherein the robust stream is encoded for 2-VSB modulation using symbol values from an alphabet comprising the symbols {−7, −5, 5, 7}.

3. The apparatus for encoding as claimed in claim 1, wherein the robust stream is encoded for 8-VSB modulation.

4. The apparatus for encoding as claimed in claim 1, further comprising a coding rate of 1/2 for encoding two output bits for every 1 input bit, wherein said control unit provides control bits to the delay registers and the plurality of multiplexers responsive to the rate input of the control unit.

5. The apparatus for encoding as claimed in claim 1, further comprising a coding rate of 1/4 for encoding 4 output bits for every 1 input bit, wherein said control unit provides control bits to the delay registers and the plurality of multiplexers responsive to the rate input of the control unit.

6. The apparatus for encoding as claimed in claim 1, further comprising a feedback connection from the trellis encoder output to an upstream data interleaver via a non-systematic RS encoder for providing backward compatibility with legacy receivers.

7. The apparatus for encoding as claimed in claim 2, wherein an information bit of the robust stream is encoded as a sign of the subset of the A/53 trellis encoder symbol alphabet.

8. The apparatus for encoding as claimed in claim 2, wherein the subset of the A/53 trellis encoder symbol alphabet providing the 2-VSB modulation comprises at least two symbols of opposite signs.

9. The apparatus for encoding as claimed in claim 2, wherein a mix ratio of robust bit stream to standard bit stream is in a range of 5% to 50%.

10. The apparatus for encoding as claimed in as claimed in claim 3, wherein a mix ratio of robust bit stream to standard bit stream is in a range of 5% to 25%.

11. In an HDTV transmission system including a transmitter for transmitting a standard bit stream and a robust bit stream for receipt by an HDTV receiver device, a system for encoding both bit streams in a backward compatible manner, said system comprising:
    means for trellis encoding said both bit streams including means for delaying encoded bytes of said both bit streams;
    said trellis encoding means further comprising means for multiplexing said both bit streams;
    means for controlling said means for delaying and said means for multiplexing of said means for trellis encoding based on a rate, stream, and modulation type of a current byte being processed;
    said means for trellis encoding further comprising:
    feedback accepting means for accepting signals from a pre-coder of an A/53 trellis encoder; and
    means for connecting to the A/53 trellis encoder wherein a symbol mapper of the A/53 trellis encoder includes a subset of an A/53 trellis encoder symbol alphabet, said subset being associated with the robust bit stream for modulating a transmitter in a manner compatible with said both bit streams.

12. The system for encoding as claimed in claim 11, comprising means for encoding providing 2-VSB modulation.

13. The system for encoding as claimed in claim 11, comprising means for encoding providing 8-VSB modulation.

14. The system for encoding as claimed in claim 11, further comprising means for coding a rate of 1/2 responsive to the rate input to said controlling means.

15. The system for encoding as claimed in claim 11, further comprising means for coding a rate of 1/4 responsive to the rate input to said controlling means.

16. The system for encoding as claimed in claim 11, further comprising a connection means for connecting feedback from the trellis encoder output to an upstream data interleaver via a non-systematic RS encoder for providing backward compatibility with legacy receivers.

17. The system for encoding as claimed in claim 12, having robust stream information bit encoding means for encoding the robust stream information bit as a sign of the subset of the A/53 trellis encoder symbol alphabet.

18. The system for encoding as claimed in claim 12, having means for providing the 2-VSB modulation, wherein the subset of the A/53 trellis encoder symbol alphabet comprises at least two symbols of opposite signs.

19. The system for encoding as claimed in claim 12, further comprising said means for encoding, wherein a mix ratio of robust bit stream to standard bit stream is in a range of 5% to 50%.

20. The system for encoding as claimed in claim 13, further comprising said means for encoding, wherein a mix ratio of robust bit stream to standard bit stream is in a range of 5% to 25%.

\* \* \* \* \*